United States Patent
Yamazaki et al.

[11] Patent Number: 6,121,683
[45] Date of Patent: Sep. 19, 2000

[54] ELECTRONIC DEVICE AND INTEGRATED CIRCUIT

[75] Inventors: Shunpei Yamazaki, Tokyo; Jun Koyama; Satoshi Teramoto, both of Kanagawa, all of Japan

[73] Assignee: Semiconductor Energy Laboratory Co., Ltd., Kanagawa-ken, Japan

[21] Appl. No.: 08/878,484

[22] Filed: Jun. 18, 1997

[30] Foreign Application Priority Data

Jun. 20, 1996 [JP] Japan ................................. 8-181299

[51] Int. Cl.⁷ ................................................ H01L 23/48
[52] U.S. Cl. .......................... 257/734; 257/350; 257/382; 257/448; 257/690; 257/698; 257/700; 257/734; 257/774
[58] Field of Search ..................... 257/690, 698, 257/700, 734, 735, 736, 758, 774, 350, 351, 357, 369, 371, 382, 448

[56] References Cited

U.S. PATENT DOCUMENTS

| | | | |
|---|---|---|---|
| 5,094,965 | 3/1992 | Ozaki et al. | 438/60 |
| 5,625,232 | 4/1997 | Numata et al. | 257/774 |
| 5,710,462 | 1/1998 | Mizushima | 257/700 |
| 5,786,616 | 7/1998 | Fukumoto et al. | 257/350 |

*Primary Examiner*—Fetsum Abraham
*Attorney, Agent, or Firm*—Fish & Richardson P.C.

[57] ABSTRACT

The present invention provides an integrated circuit structure in which an area necessary for making contact is assured in a multi-layered wiring structure even when a design rule is made rigorous. In a structure in which wires separated above and below by an interlayer insulating film are contacted, the wire at the lower layer is patterned into a pattern of the wire at the upper layer which are made to contact. Thereby, the present invention allows the area necessary for making the contact to be largely assured and to deal with the micronization.

24 Claims, 7 Drawing Sheets

ELECTRONIC DEVICE AND INTEGRATED CIRCUIT

BACKGROUND OF THE INVENTION

1. Field of the Invention

The present invention disclosed in the present specification relates to a structure of a contact in a semiconductor integrated circuit having a multi-layered wiring structure.

2. Description of Related Art

Hitherto, there has been known a structure of an integrated circuit in which thin film transistors are integrated and arranged on a glass substrate or a quartz substrate.

The thin film transistors are utilized mainly in an active matrix type liquid crystal display. The active matrix liquid crystal display has a structure in which the thin film transistor is disposed in each of pixels arranged in a matrix of several hundreds x several hundreds pixels. The thin film transistor disposed in each pixel has a function of individually controlling charge input/output to/from a pixel electrode.

There has been also known a structure in which peripheral driving circuits for driving the active matrix region are constructed by the thin film transistors and are integrated on the same substrate together with the active matrix region (called as a peripheral integrated circuit type).

In constructing the peripheral driving circuit described above by the thin film transistors, it is necessary to construct such that the plurality of thin film transistors are connected in series.

FIG. 4 shows one example of such structure, i.e. the example in which two thin film transistors are connected in series. That is, a drain of one thin film transistor is connected to a gate of the other thin film transistor.

In the structure shown in FIG. 4, a drain electrode (electrode in contact with the drain region) 11 of one thin film transistor needs to be contacted with a gate electrode 12 of the other thin film transistor. FIG. 6 shows an equivalent circuit of the structure shown in FIG. 4.

FIG. 5 shows a section of this contact taken along a line A–A' in FIG. 4. In FIG. 5, the reference numeral (14) denotes a glass substrate, (13) an interlayer insulating film and (10) a gate insulating film.

The drain electrode 11 and the gate electrode 12 are disposed above and below separately through an intermediary of the interlayer insulating film 13. Various metallic and silicide materials may be used generally as the material of the both electrodes 11 and 12.

In such a structure, an effective area (contact area) substantially utilized for the contact is only the part where a contact aperture denoted by the reference numeral (15) is formed. A region whose size is denoted by the reference numeral (16) is what has been necessary to take a margin in positioning them and becomes useless after forming the contact. That is, this region is not utilized for the contact and is a factor hampering the integration of the circuit.

There is also a problem when a design rule is made rigorous in order to increase the integration that the area of the contact is reduced in proportion to square thereof. For instance, when the design rule is reduced to 5 $\mu$m to 3 $\mu$m, the area of the contact is reduced by $(3/5)^2$ times.

It means that current density is increased by $(5/3)^2$ times in the contact provided that an operating state required to the thin film transistor is the same.

Such circumstance may cause a failure in the contact. That is, it may cause heat locally in the contact, causing the failure of the contact. The more rigorous the design rule is, the more serious this problem becomes.

Accordingly, it is an object of the present invention disclosed in the present specification to improve the above-mentioned contact structure which has been hampering the integration of circuits to provide a contact structure which allows a higher integration to be obtained.

It is another object of the present invention to provide a structure in which a contact area will not be remarkably reduced even when the design rule is made rigorous.

SUMMARY OF THE INVENTION

FIGS. 3A through 3C show an integrated circuit according to one of the inventions disclosed in the present specification. FIG. 3A shows a state thereof seen from the top, FIG. 3B is a section view thereof taken along a line A–A' in FIG. 3A and FIG. 3C is a section view thereof taken along a line B–B' in FIG. 3A.

The integrated circuit shown FIGS. 3A through 3C comprises a first electrode or wire 104 existing under an interlayer insulating film 205; a second electrode or wire 107 existing above the interlayer insulating film 205; and a contact section in which the first electrode or wire is in contact with the second electrode or wire in an aperture 106 created on the interlayer insulating film; and is characterized in that the first electrode or wire is patterned into a pattern of the second electrode or wire within the aperture 106.

According to another invention, an integrated circuit comprises, as shown concretely in FIGS. 3A through 3C, a first electrode or wire 104 existing under an interlayer insulating film 205; a second electrode or wire 107 existing above the interlayer insulating film 205; and a contact section in which the first electrode or wire 104 is in contact with the second electrode or wire 107 in an aperture 106 created on the interlayer insulating film 205; and is characterized in that a side face of end of the first electrode or wire 104 is identical or approximately identical to a side face of end of the second electrode or wire 107 within the aperture 106.

The above structure may be obtained by patterning the first electrode or wire 104 into a pattern of the second electrode or wire 107.

According to a still other invention, an integrated circuit comprises a first electrode or wire existing under an interlayer insulating film; a second electrode or wire existing above the interlayer insulating film; and a contact section in which the first electrode or wire is in contact with the second electrode or wire in an aperture created on the interlayer insulating film; and is characterized in that an area in which the first electrode or wire contacts with the second electrode or wire within the aperture is smaller than an area of the aperture.

The above structure may be obtained by patterning the first electrode or wire into a pattern of the second electrode or wire within the aperture 106.

According to another invention, a method for fabricating an integrated circuit comprises steps of forming a first electrode or wire; forming an interlayer insulating film on the first electrode or wire; creating an aperture on the interlayer insulating film; and forming a second electrode or wire on the interlayer insulating film; and is characterized in that the step for forming the second electrode or wire comprises steps of making contact of the first electrode or wire with the second electrode or wire within the aperture; and patterning the first electrode or wire and the second electrode or wire in the identical pattern within the aperture.

As a material of the electrodes or wires, aluminum, tantalum and other metallic materials and various silicide materials may be used.

As described above, the wire 104 at the lower layer is patterned by the pattern of the electrode 107 at the upper layer within the aperture 106 as shown in FIG. 3B.

The structure described above allows an electrode area necessary for taking a margin for making contact to be eliminated and only an effective area portion necessary for the contact to be left within the aperture. It then allows the contact area to be increased while realizing the micronization.

The specific nature of the invention, as well as other objects, uses and advantages thereof, will clearly appear from the following description and from the accompanying drawings.

DESCRIPTION OF PREFERRED EMBODIMENTS

[First Embodiment]

FIGS. 1 through 3 schematically show a process for fabricating an integrated circuit according to the present embodiment. A thin film transistor shown in the present embodiment has a form called a top gate type in which a gate electrode is positioned above an active layer.

Figure 1A:
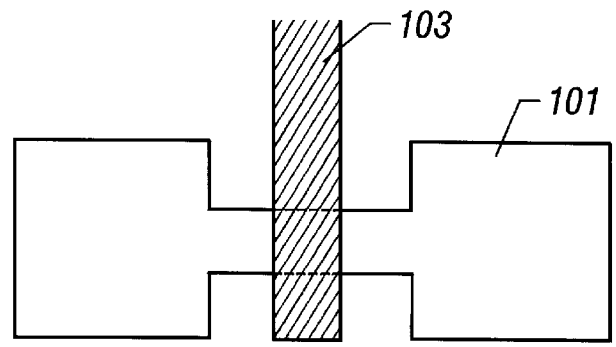
FIGS. 1A through 1C are drawings showing steps for fabricating a structure in which thin film transistors are connected in series.
Figure 1A:
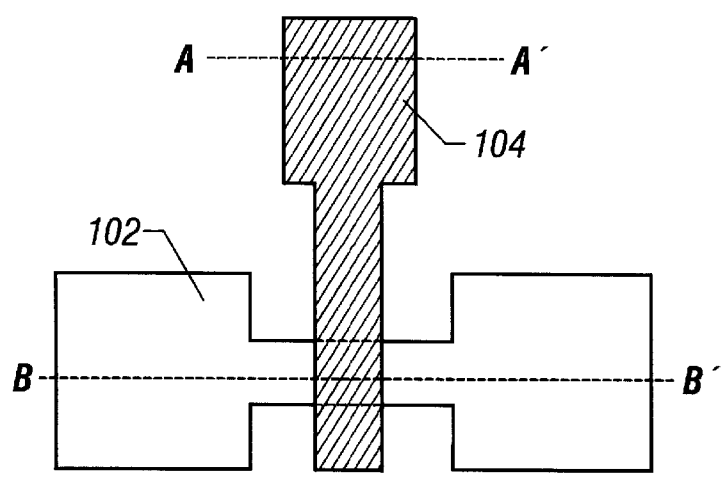
Figure 1B:
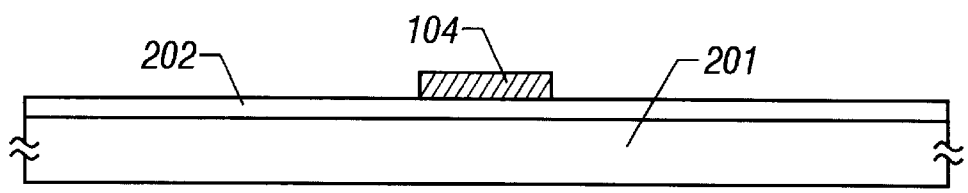

At first, a glass substrate 201 is prepared as shown in FIG. 1B. Then, an underlying layer not shown is formed on the glass substrate 201. A silicon oxide film is used as the underlying layer.

Next, an amorphous silicon film not shown is formed by means of plasma CVD or low pressure thermal CVD. Then, laser light is irradiated to the amorphous silicon film thus obtained to obtain a crystal silicon film. This crystal silicon film is patterned further to obtain active layers 101 and 102 shown in FIG. 1A.

After obtaining the active layers 101 and 102 of the thin film transistors, a gate insulating film 202 shown in FIG. 1B is formed. A silicon oxide film is used for the gate insulating film 202.

After forming the gate insulating film 202, gate electrodes (and gate wires extended therefrom) 103 and 104 are formed. FIG. 1A shows patterns of the gate electrodes 103 and 104. The gate electrodes 103 and 104 are made by using tantalum.

Figure 1C:
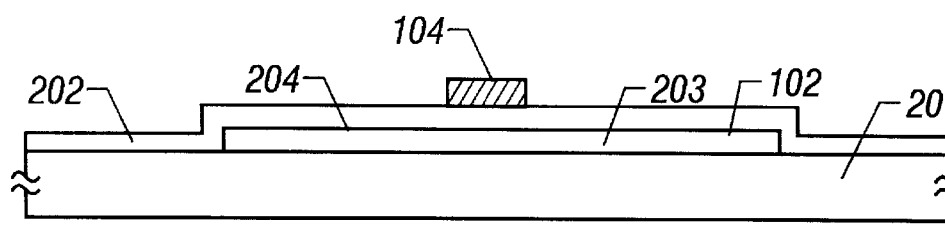

Thus, the state shown in FIGS. 1A through 1C is obtained. FIG. 1B is a section view taken along a line A–A' in FIG. 1A and FIG. 1C is a section view taken along a line B–B' in FIG. 1A.

After forming the gate electrodes 103 and 104, impurity ions are implanted to the active layers 101 and 102 to form source and drain regions in a manner of self-alignment. That is, the impurity ions are implanted to the regions of the active layers 101 and 102 where no shield is provided by the gate electrodes 103 and 104. The regions where the impurity ions are implanted become P or N type region. Then, the regions where the impurity ions are implanted become the source and drain regions. In FIG. 1C, a region 203 is the source region formed on the active layer 102 and a region 204 is the drain region.

Figure 2A:
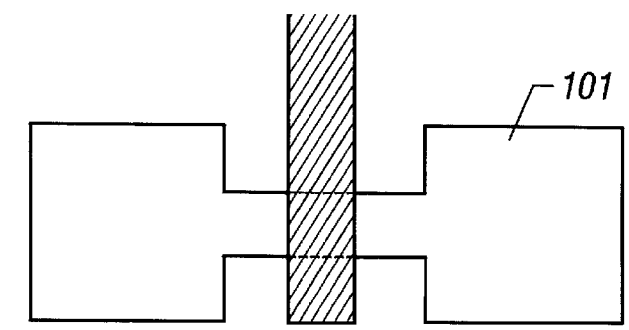
FIGS. 2A through 2C are drawings showing steps for fabricating the structure in which thin film transistors are connected in series.
Figure 2A:
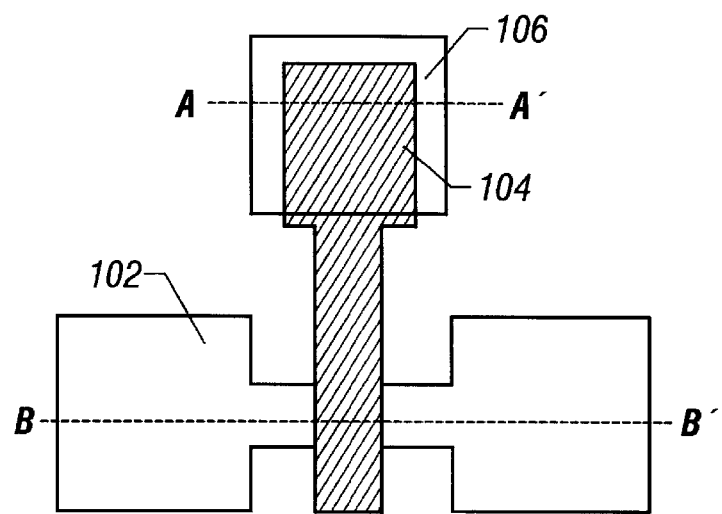
Figure 2B:
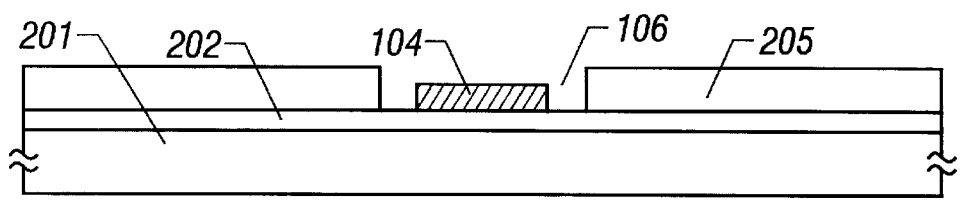
Figure 2C:
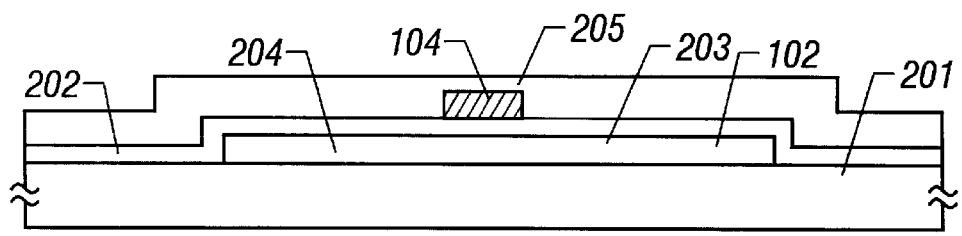

Next, an interlayer insulating film 205 shown in FIG. 2B is formed. A silicon nitride film is used for the interlayer insulating film 205. After forming the interlayer insulating film 205, an aperture 106 is created. Thus, the state shown in FIGS. 2A through 2C is obtained. FIG. 2B is a section view taken along a line A–A' in FIG. 2A and FIG. 2C is a section view taken along a line B–B' in FIG. 2A.

Not only a single layer film but a multi-layered film may be used for the interlayer insulating film 205.

Next, a metallic material for forming electrodes which contact with the source and drain regions of the thin film transistor is formed. Here, a metallic film composed of laminated films of titanium, aluminum and titanium is formed by means of sputtering. It is also possible to use a single layer metallic film as a matter of course.

Figure 3A:
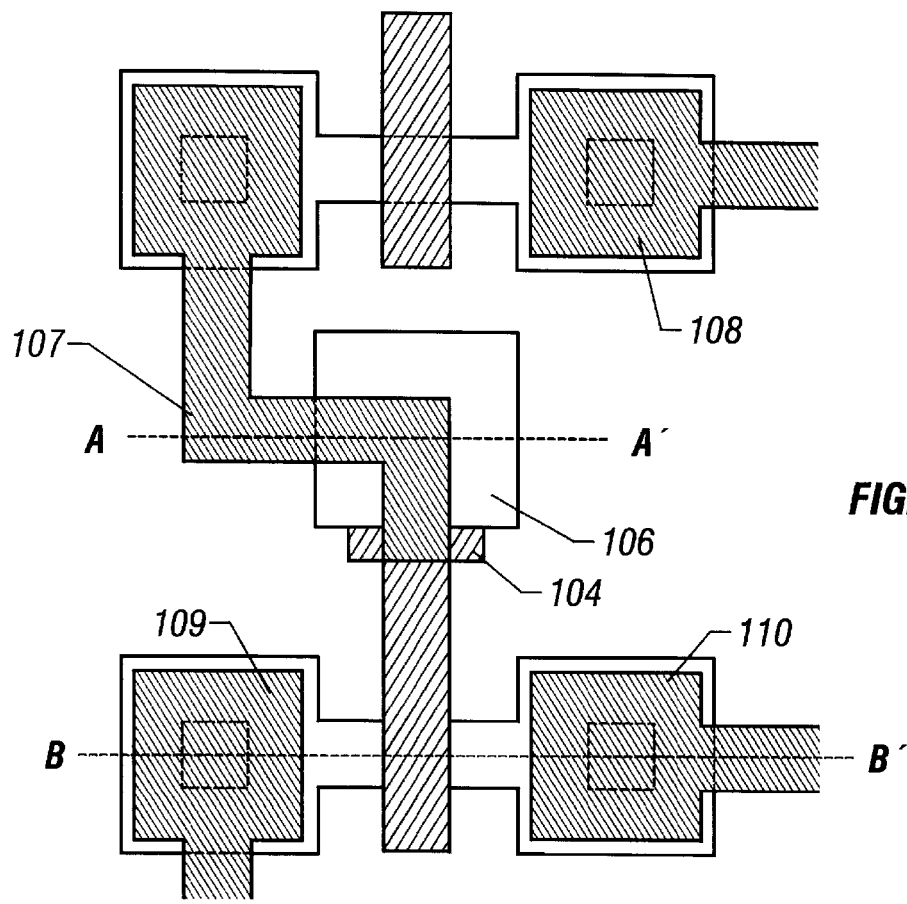
FIGS. 3A through 3C are drawings showing steps for fabricating the structure in which thin film transistors are connected in series.
Figure 3B:
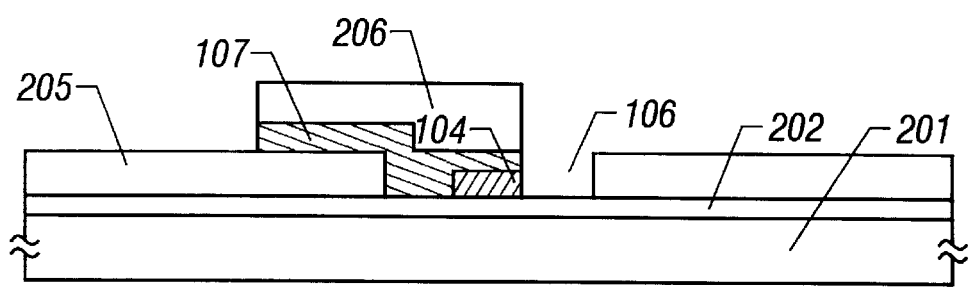
Figure 3C:
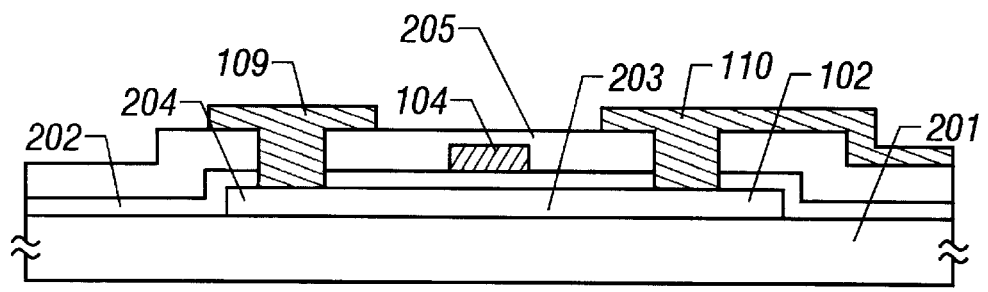
Figure 4:
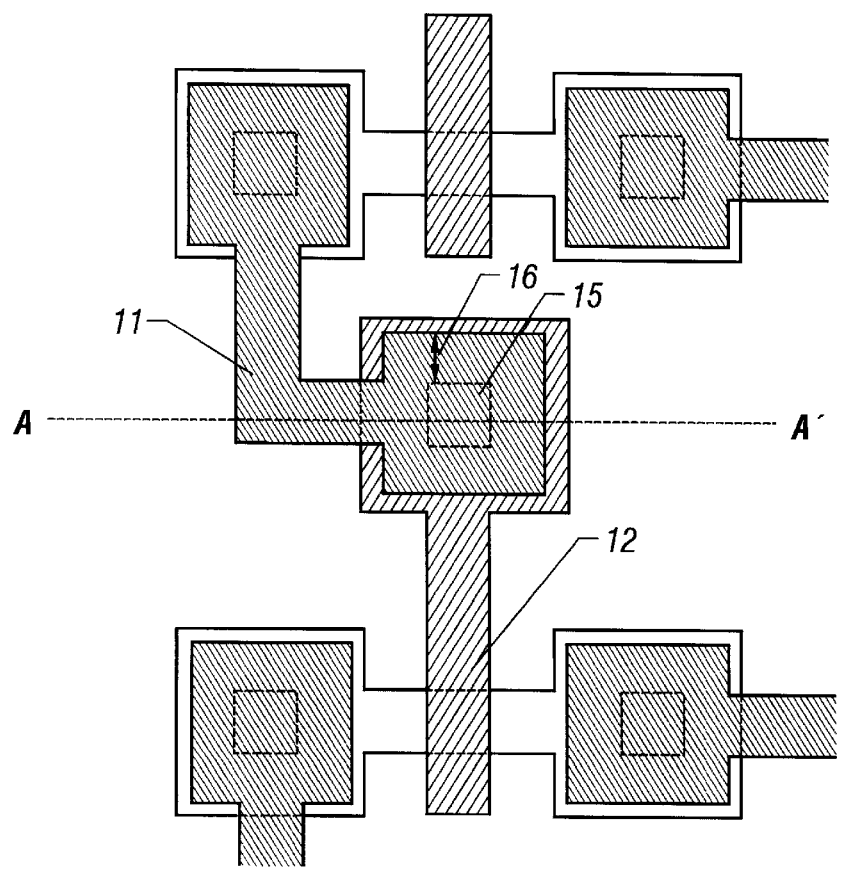
FIG. 4 is a plan view showing a structure in which thin film transistors are connected in series in the prior art technology.
Figure 5:
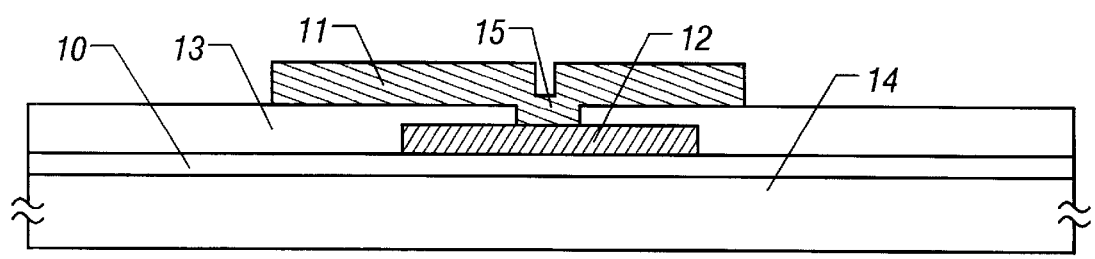
FIG. 5 is a section view showing the structure in which the thin film transistors are connected in series in the prior art technology.
Figure 6:
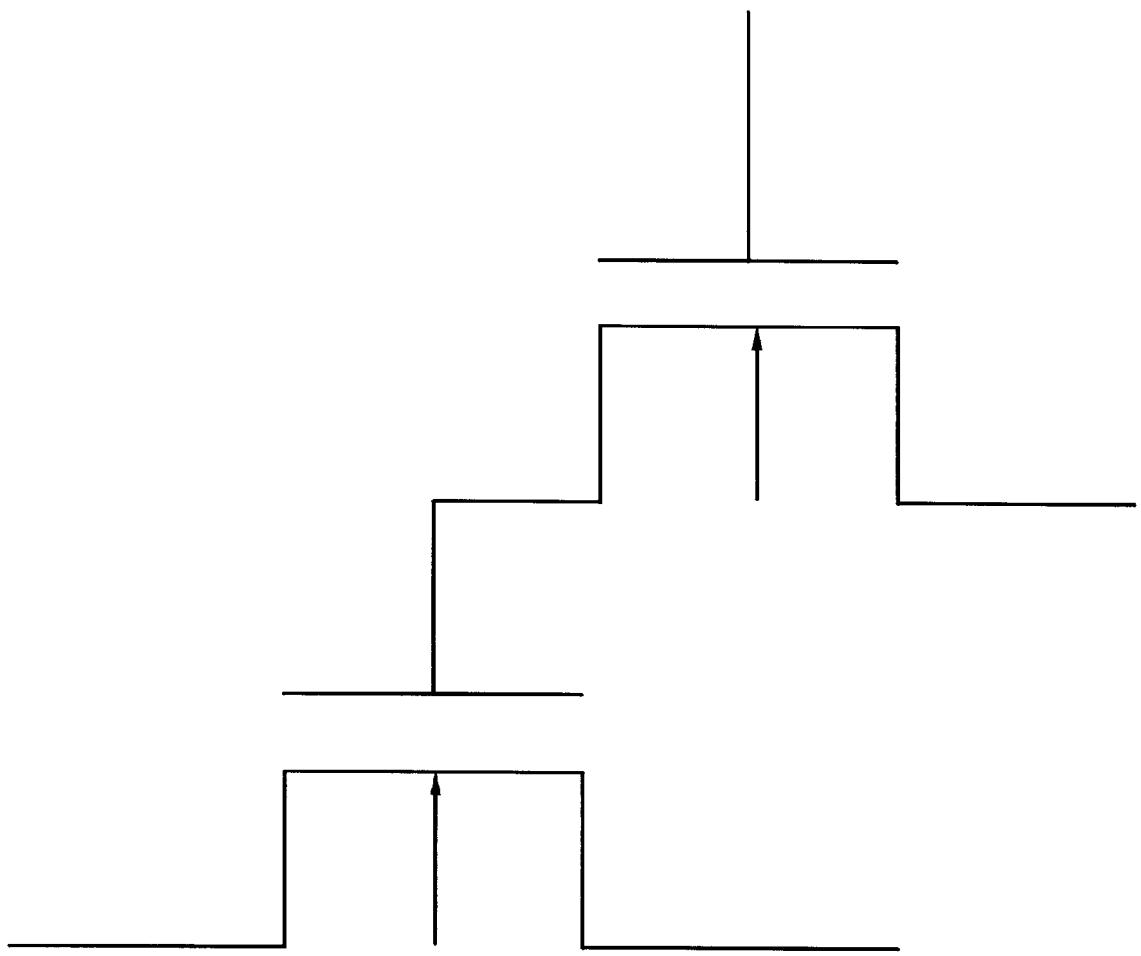
FIG. 6 is a diagram showing an equivalent circuit of the structure in FIG. 4.

Then, this metallic film is patterned to form electrode patterns 107, 108, 109 and 110 shown in FIGS. 3A through 3C. This patterning is carried out by means of dry etching.

FIG. 3B is a section view taken along a line A–A' in FIG. 3A and FIG. 3C is a section view taken along a line B–B' in FIG. 3A. In FIG. 3A, the electrode 107 contacts with the gate electrode 104 within the aperture 106 and contacts with the drain region of the thin film transistor at the upper part of the figure.

The source electrode 108 contacts with the source region of the thin film transistor at the upper part of the figure. The drain electrode 109 contacts with the drain region 204 of the thin film transistor at the lower part of the figure. The source electrode 110 contacts with the source region of the thin film transistor at the lower part of the figure.

What is important in the state shown in FIGS. 3A through 3C is that the electrode 107 which makes the contact within the aperture 106 is patterned into a predetermined shape and the gate electrode 104 is also patterned into the same pattern with the electrode wire 107 within the aperture 106 in the same time.

Thereby, a large contact area may be assured upon assuring a positioning margin for making the contact.

The effectiveness described above may be obtained by arranging such that the electrode wire 107 is patterned within the aperture 106. That is, the large contact area and the micronization may be realized in the same time by assuring the contact area by positioning the electrode wire 107 and the gate electrode 104 within the aperture 106 and by removing part of the gate electrode 104 which is not necessary for the contact in the same time.

As shown in FIG. 3B, the gate electrode 104 is patterned into the same pattern with the drain electrode 107 within the aperture 106 by utilizing a resist mask 206 for patterning the drain electrode 107.

Thus, the structure in which the drain of one thin film transistor is connected with the gate of the other thin film transistor may be obtained.

[Second Embodiment]

The invention disclosed in the present specification may be utilized in an active matrix liquid crystal display in which peripheral driving circuits are integrated.

It is very useful to utilize the invention disclosed in the present specification in the active matrix liquid crystal display in which peripheral driving circuits are integrated because the peripheral driving circuits are required to be highly integrated.

Figure 7A:
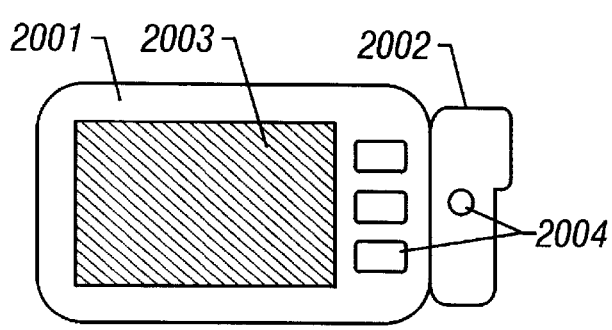
FIGS. 7A through 7E are drawings showing examples of equipments to which an active matrix type liquid crystal display is applied.

FIG. 7A shows an equipment called a digital still camera, an electronic camera or a video movie which is capable of displaying motion pictures.

This equipment has functions of electronically preserving images taken by a CCD camera (or appropriate photographing means) disposed at a camera section 2002 and of displaying the images on a liquid crystal display 2003 disposed on a main body 2001. The equipment may be controlled by manipulating control buttons 2004. The invention disclosed in the present specification is applied to a peripheral driving circuit of the liquid crystal display 2003.

The utilization of the invention disclosed in the present specification allows high brightness to be obtained because it allows the liquid crystal display having a high aperture rate to be obtained.

Figure 7B:
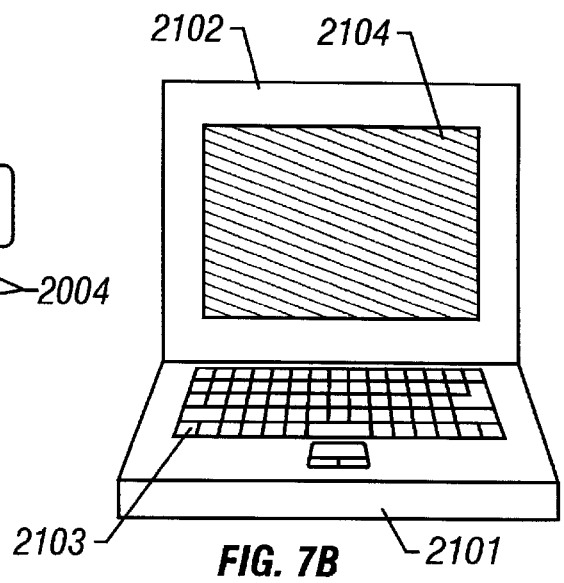

FIG. 7B shows a portable personal computer. This equipment is provided with a liquid crystal display 2104 on an openable cover 2102 attached to a main body 2101. It allows various information to be input from a keyboard 2103 and various operations to be performed. The invention disclosed in the present specification is applied to a peripheral driving circuit of the liquid crystal display 2104.

Figure 7C:
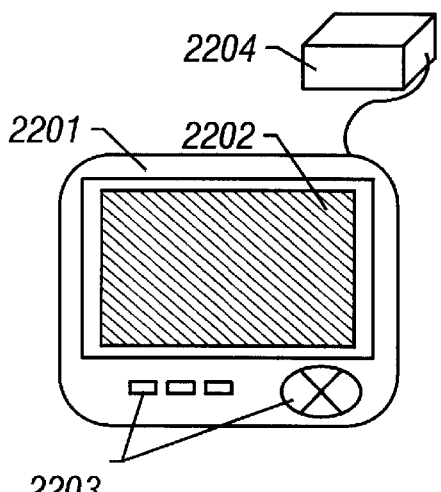

FIG. 7C shows a case when a flat panel display is utilized in a car navigation system. The car navigation system is composed of an antenna section 2204 and a main body 2201 provided with a liquid crystal display 2202.

Various information required for the navigation may be switched by control buttons 2203. In general, the control is made by a remote controller not shown. The invention disclosed in the present specification is applied to a peripheral driving circuit of the liquid crystal display 2302.

Figure 7D:
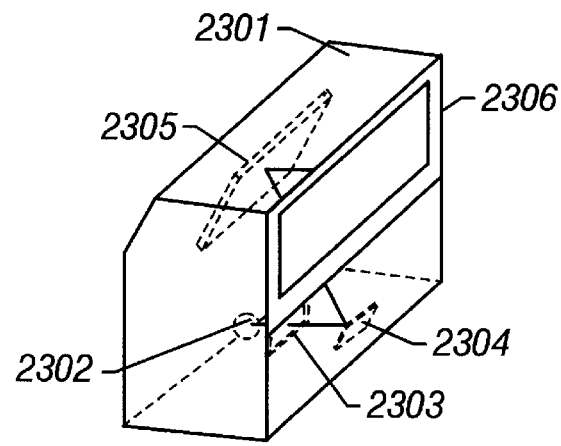

FIG. 7D shows a case of a projection type liquid crystal display. In the figure, light emitted from a light source 2302 is optically modulated by a liquid crystal display 2303 and forms an image. The image is reflected by mirrors 2304 and 2305 and is projected to a screen 2306. The invention disclosed in the present specification is applied to a peripheral driving circuit of the liquid crystal display 2403.

Figure 7E:
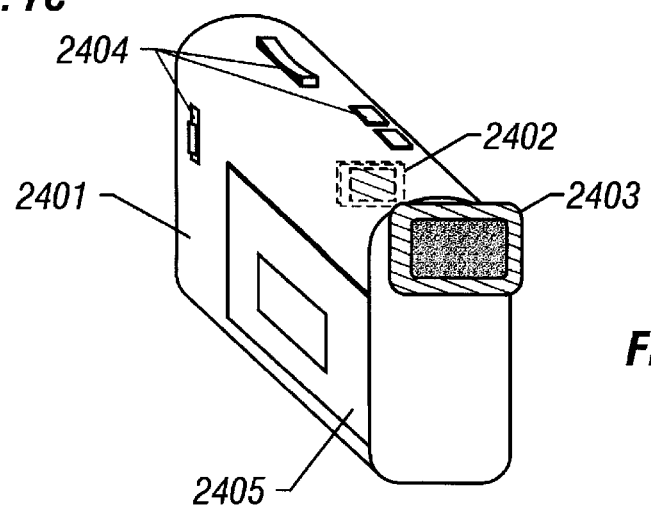

FIG. 7E shows a case in which a display called a view finder is attached to a main body 2401 of a video camera. The view finder is composed of, roughly, a liquid crystal display 2402 and an eye-piece section 2403 on which an image is imaged.

The video camera shown in FIG. 7E may be controlled by manipulating control buttons 2404 and the image is recorded in a magnetic tape stored in a tape holder 2405. The image taken by a camera not shown is displayed on the display 2402. The image recorded in the magnetic tape may be also displayed on the display 2402. The invention disclosed in the present specification is applied to a peripheral driving circuit of the liquid crystal display 2402.

[Third Embodiment]

The present embodiment is a case when the invention disclosed in the present specification is applied to an integrated circuit composed of bottom gate type thin film transistors.

Figure 8A:
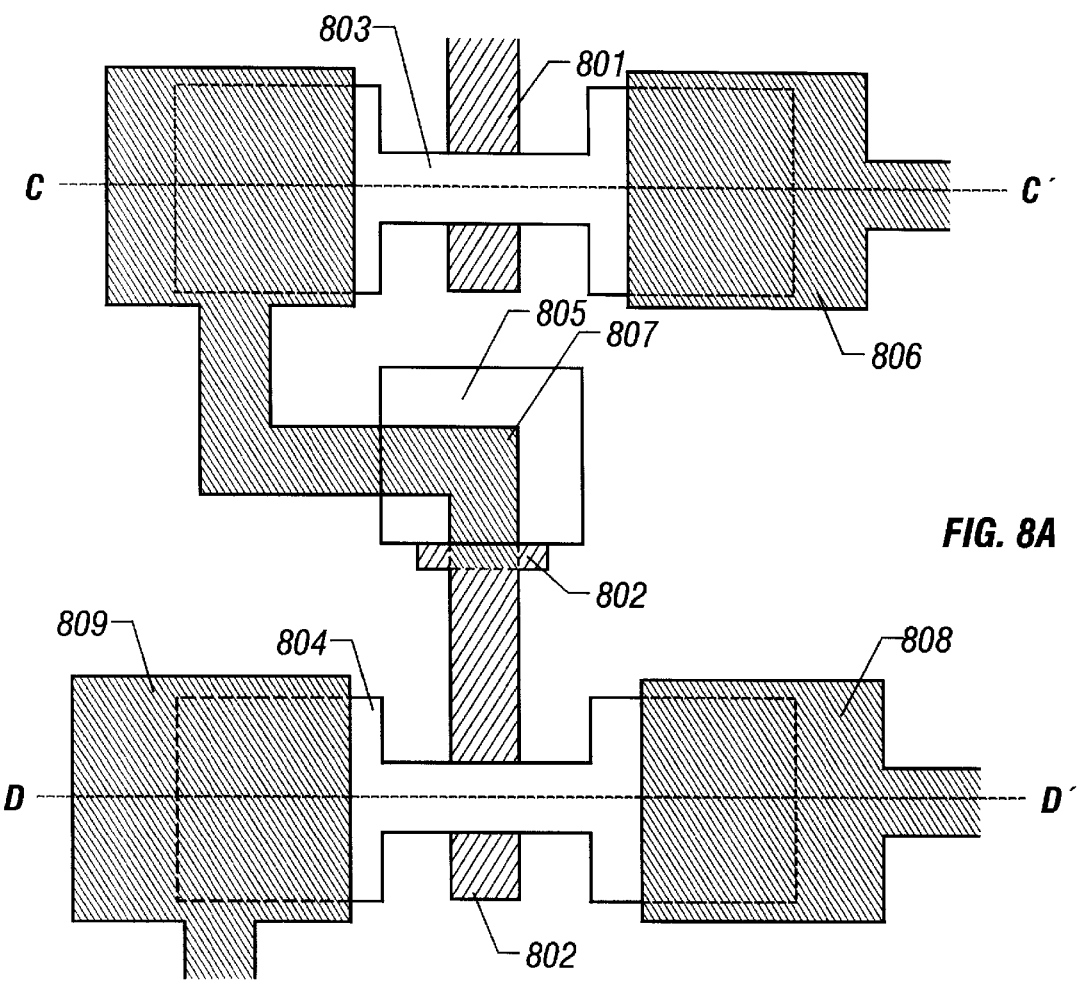
FIGS. 8A through 8C are drawings showing a structure in which thin film transistors are connected in series.
Figure 8B:
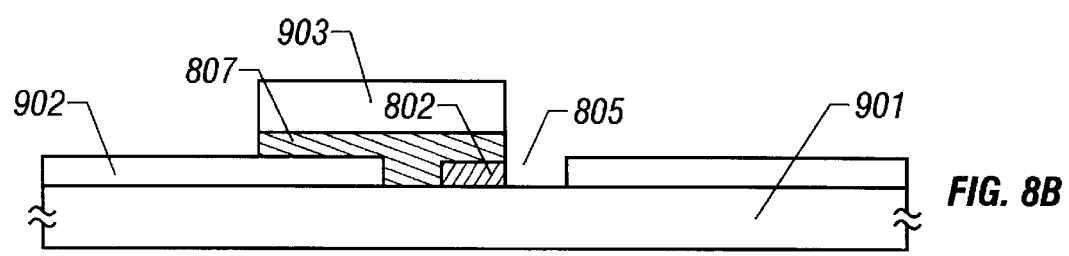
Figure 8C:
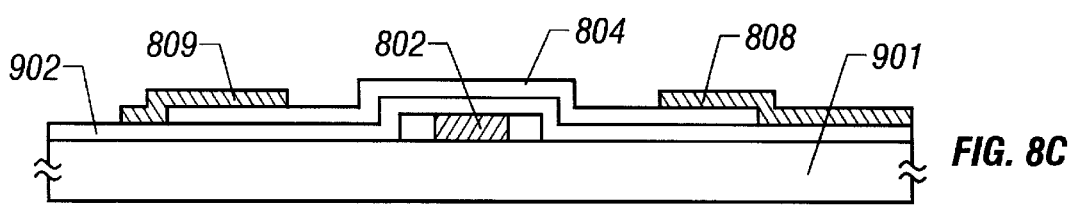

FIG. 8A is a plan view of the thin film transistors of the present embodiment. FIG. 8B is a section view taken along a line C–C' in FIG. 8A and FIG. 8C is a section view taken along a line D–D' in FIG. 8A.

In the present embodiment, gate electrodes 801 and 802 are formed on a substrate 901 at first. The gate electrodes 801 and 802 are formed by molybdenum silicide in the present embodiment.

Next, a silicon oxide film which functions as a gate insulating film 902 is formed. Then, active layers 803 and 804 made of crystal silicon film are formed thereon.

Next, although not shown, source and drain regions are formed by selectively implanting impurity ions to the active layers 803 and 804. After implanting the impurity ions, the source and drain regions are activated by irradiating laser light.

Next, an aperture 805 is created on the gate insulating film 902. It is preferable to utilize dry etching in creating the aperture 805.

Next, a metallic film is formed to construct source electrodes 806 and 808 and drain electrodes 807 and 809. Here, molybdenum silicide is used for the metallic film.

Then, the metallic film is patterned to form the source electrodes 806 and 808 and the drain electrodes 807 and 809. The drain electrode 807 contacts with the gate electrode 802.

At the time when the drain electrode 807 is formed, the gate electrode 802 is patterned into the pattern of the electrode 807 within the aperture 805 by a resist mask 903.

Thus, the state shown in FIGS. 8A through 8C may be obtained.

[Fourth Embodiment]

The present embodiment is a case when aluminum is used for the electrode in the lower layer (gate electrode) in the structure shown in the first or third embodiment.

Aluminum is one of materials suitable for making a wire and an electrode because its resistance is low. However, an aluminum thin film has a problem that projections called hillock are formed on the surface thereof by heat.

In order to solve this problem, there have been technologies of forming another metallic film on the surface of aluminum as a barrier film and of forming an insulating film such as silicon nitride film to suppress the occurrence of hillock.

Further, there has been a technology of forming an aluminum oxide film on the surface thereof as a barrier film by anodizing by setting the aluminum pattern as an anode to suppress the occurrence of hillock. It is also effective to form an aluminum oxide film on the surface of the aluminum pattern as a barrier film by implementing plasma treatment within an oxidizing atmosphere.

When the hillock preventing measure is taken as described above, it becomes necessary to remove the barrier film formed on the surface of the aluminum electrode. Further, it is also effective to facilitate the creation of the aperture without forming the barrier film selectively only on the region where the aperture for the contact is to be formed.

The contact structure which allows high integration to be obtained may be obtained by utilizing the invention disclosed in the present specification.

In particular, it can provide the structure which allows the area of contact section to be assured even when the design rule is made rigorous.

The invention disclosed in the present specification may be utilized in an EL type display in which peripheral driving circuits are integrated and a display using EC (electrochromics) material.

It may be also applied to various thin film integrated circuits, allowing high integration to be obtained.

While preferred embodiments have been described, variations thereto will occur to those skilled in the art within the scope of the present inventive concepts which are delineated by the following claims.

What is claimed is:

1. An integrated circuit, comprising:
   a gate electrode or wire of a first transistor provided under an interlayer insulating film;
   a drain electrode or wire provided above said interlayer insulating film and connected with a drain region of a second transistor through a drain contact hole provided in said interlayer insulating film; and
   a contact section in which said gate electrode or wire is in contact with said drain electrode or wire, said contact section formed in an aperture created on said interlayer insulating film;
   said gate electrode or wire being patterned into a pattern of said drain electrode or wire within said aperture, wherein said first and second transistors are connected with each other through said gate electrode or wire and said drain electrode or wire.

2. A circuit according to claim 1 wherein said interlayer insulating film has a single layer structure or a multi-layered structure.

3. The circuit of claim 1 wherein said two transistors have a top gate type.

4. A circuit according to claim 1 wherein said integrated circuit is provided in an EL type of display.

5. An integrated circuit, comprising:
   a gate electrode or wire of a first transistor provided under an interlayer insulating film;
   a drain electrode or wire provided above said interlayer insulating film and connected with a drain region of a second transistor through a drain contact hole provided in said interlayer insulating film; and
   a contact section in which said gate electrode or wire is in contact with said drain electrode or wire, said contact section formed in an aperture created on said interlayer insulating film;
   a side wall of said gate electrode or wire being aligned or approximately aligned to a side wall of said drain electrode or wire within said aperture,
   wherein said first and second transistors are connected with each other through said gate electrode or wire and said drain electrode or wire.

6. A circuit according to claim 5 wherein said interlayer insulating film has a single layer structure or a multi-layered structure.

7. The circuit of claim 5 wherein said two transistors have a top gate type.

8. A circuit according to claim 5 wherein said integrated circuit is provided in an EL type of display.

9. An integrated circuit, comprising:
   a gate electrode or wire of a first transistor provided under an interlayer insulating film;
   a drain electrode or wire provided above said interlayer insulating film and connected with a drain region of a second transistor through a drain contact hole provided in said interlayer insulating film; and
   a contact section in which said gate electrode or wire is in contact with said drain electrode or wire, said contact section formed in an aperture created on said interlayer insulating film,
   wherein an area in which said gate electrode or wire contacts with said drain electrode or wire within said aperture is smaller than an area of said aperture,
   wherein said first and second transistors are connected with each other through said gate electrode or wire and said drain electrode or wire.

10. A circuit according to claim 9 wherein said interlayer insulating film has a single layer structure or a multi-layered structure.

11. The circuit of claim 9 wherein said two transistors have a top gate type.

12. A circuit according to claim 9 wherein said integrated circuit is provided in an EL type of display.

13. An electronic device comprising:
    an electro-optical device comprising an active matrix circuit and a peripheral driving circuit, said peripheral driving circuit comprising:
    a gate electrode or wire of a first transistor provided under an interlayer insulating film;
    a drain electrode or wire provided above said interlayer insulating film and connected with a drain region of a second transistor through a drain contact hole provided in said interlayer insulating film; and
    a contact section in which said gate electrode or wire is in contact with said drain electrode or wire, said contact section formed in an aperture created on said interlayer insulating film;
    said gate electrode or wire being patterned into a pattern of said drain electrode or wire within said aperture,
    wherein said first and second transistors are connected with each other through said gate electrode or wire and said drain electrode or wire.

14. A device according to claim 13 wherein said electronic device is a digital still camera, an electronic camera, a video movie, a portable personal computer, a car navigation system, a projection type liquid crystal display, or a view finder used in a video camera.

15. The device of claim 13 wherein said two transistors have a top gate type.

16. A circuit according to claim 13 wherein said integrated circuit is provided in an EL type of display.

17. An integrated circuit, comprising:
    a gate electrode or wire of a first transistor provided under a gate insulating film;
    a drain electrode or wire provided above said gate insulating film and connected with a drain region of a second transistor through a drain contact hole provided in said interlayer insulating film; and
    a contact section in which said gate electrode or wire is in contact with said drain electrode or wire, said contact section formed in an aperture created on said gate insulating film;
    said gate electrode or wire being patterned into a pattern of said drain electrode or wire within said aperture,
    wherein said first and second transistors are connected with each other through said gate electrode or wire and said drain electrode or wire, and
    wherein said two transistors have a bottom gate type.

18. A circuit according to claim 17 wherein said integrated circuit is provided in an EL type of display.

19. An integrated circuit, comprising:
    a first electrode or wire provided under an interlayer insulating film;
    a second electrode or wire provided above said interlayer insulating film and connected with a drain region of a first transistor through a drain contact hole provided in said interlayer insulating film; and
    a contact section in which said first electrode or wire is in contact with said second electrode or wire, said contact section formed in an aperture created on said interlayer insulating film, wherein said first electrode or wire is patterned into a pattern of said second electrode or wire within said aperture, wherein said first electrode or wire is a gate electrode or wire of a second transistor; and wherein said first and second transistors are connected with each other through said first electrode or wire and said second electrode or wire.

20. The circuit of claim 19 wherein said two transistors have a top gate type.

21. A circuit according to claim 19 wherein said integrated circuit is provided in an EL type of display.

22. An integrated circuit, comprising:

a first electrode or wire provided under an interlayer insulating film;

a second electrode or wire provided above said interlayer insulating film and connected with a drain region of a transistor through a drain contact hole provided in said interlayer insulating film; and a contact section in which said first electrode or wire is in contact with said second electrode or wire, said contact section formed in an aperture created on said interlayer insulating film, wherein said first electrode or wire is patterned into a pattern of said second electrode or wire within said aperture, wherein two transistors are connected with each other through said first electrode or wire and said second electrode or wire, and wherein said second electrode or wire is a drain electrode or wire of one of said two transistors.

23. The circuit of claim 22 wherein said two transistors have a top gate type.

24. A circuit according to claim 22 wherein said integrated circuit is provided in an EL type of display.

* * * * *